United States Patent [19]

Raicu

[11] Patent Number: 4,561,907

[45] Date of Patent: Dec. 31, 1985

[54] PROCESS FOR FORMING LOW SHEET RESISTANCE POLYSILICON HAVING ANISOTROPIC ETCH CHARACTERISTICS

[76] Inventor: Bruha Raicu, 1033 Crestview Dr., Apt. 307, Mountain View, Calif. 94040

[21] Appl. No.: 630,091

[22] Filed: Jul. 12, 1984

[51] Int. Cl.[4] ............... H01L 21/265; H01L 21/268
[52] U.S. Cl. .................... 148/1.5; 29/576 B; 29/571; 148/175; 148/187; 148/DIG. 4; 156/643; 156/646; 357/59; 357/91
[58] Field of Search .............. 148/1.5, 187, 175; 29/571, 576 B; 357/59, 91; 156/643, 646

[56] References Cited

U.S. PATENT DOCUMENTS

| | | | |
|---|---|---|---|
| 4,208,241 | 6/1980 | Harshbarger et al. | 156/643 |
| 4,309,224 | 1/1982 | Shibata | 148/1.5 |
| 4,383,885 | 5/1983 | Maydan et al. | 156/643 |
| 4,394,191 | 7/1983 | Wada et al. | 148/33.1 |
| 4,415,383 | 11/1983 | Naem et al. | 148/187 |
| 4,419,812 | 12/1983 | Topich | 29/571 |
| 4,420,344 | 12/1983 | Davies et al. | 148/1.5 |
| 4,455,738 | 6/1984 | Houston et al. | 29/571 |
| 4,466,179 | 8/1984 | Kasten | 29/576 T |

OTHER PUBLICATIONS

D'Ouville et al, J. Appl. Phys., 53 (1982) 5086.

*Primary Examiner*—Upendra Roy
*Attorney, Agent, or Firm*—Flehr, Hohbach, Test, Albritton & Herbert

[57] ABSTRACT

A method for forming highly doped, low sheet resistance, anisotropically etched polysilicon using heat pulse annealing and plasma etching. The combination of low sheet resistance and anisotropic etch behavior is provided by heat pulse annealing for a time which corresponds to a characteristic transition region of the sheet resistance-annealing time curve.

16 Claims, 17 Drawing Figures

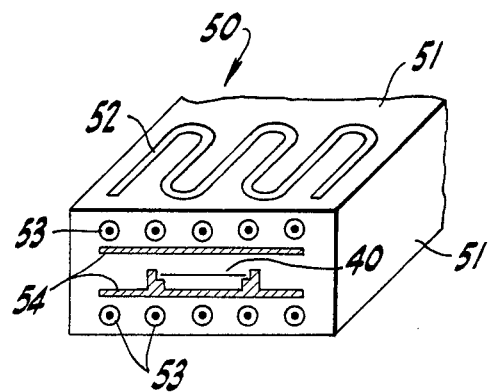
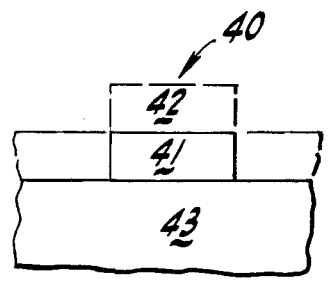
FIG._5  FIG._4
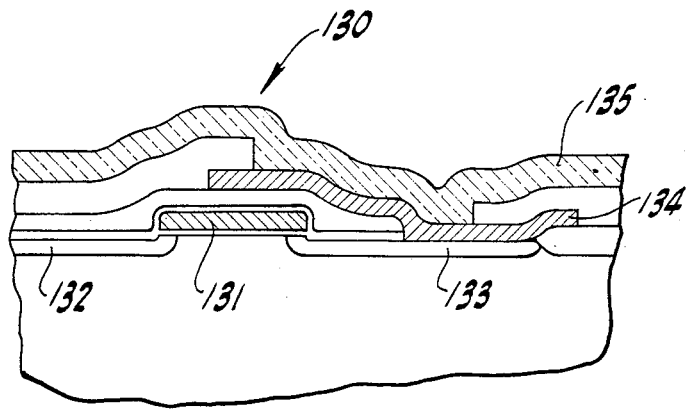
FIG._17

PROCESS FOR FORMING LOW SHEET RESISTANCE POLYSILICON HAVING ANISOTROPIC ETCH CHARACTERISTICS

BACKGROUND OF THE INVENTION

The present invention relates to highly doped polycrystalline silicon (polysilicon) technology and to a process for forming fine polysilicon patterns with a high degree of precision. In particular, the invention relates to a method of treating polysilicon material using ion implantation and rapid thermal heating or annealing techniques to provide a highly doped, low sheet resistance polysilicon structure which has a high etch rate, excellent pattern transfer and anisotropic etch characteristics.

Polycrystalline silicon has long been the most widely used gate material in MOS LSI technology. The greatest impetus to the use of polysilicon resulted from the development of the self-aligned gate technology. The self-aligned gate process involves forming the source and drain in the presence of the gate, which functions as a self-aligning dopant mask. As IC (integrated circuit) structures have been scaled to smaller and more shallow sizes, the prevalent doping process has evolved from furnace predeposition and diffusion to ion implantation. Furthermore, the need for a high melting point material which can withstand the self-aligned process temperatures has resulted in aluminum being replaced by polysilicon as the prevalent gate material. Polysilicon is widely used in both bipolar and MOS IC technology, for example in conductors, such as single-level and multi-level interconnects; in resistors; in buried contacts; and in the formation of emitter structures such as shallow, self-aligned emitters and self-aligned emitter-contact structures.

With the trend toward ever greater device densities and smaller minimum feature sizes and smaller separations in VLSI integrated circuits, the sheet resistance of multi-level interconnects and gate electrodes and other conductors becomes a primary factor affecting frequency characteristics and power consumption, and in limiting device speed. Thus, to successfully implement greater density without adversely affecting such characteristics, it is necessary to reduce the sheet resistance of the gate and conductor material.

Another requirement which must be met to achieve the increasingly small minimum feature sizes and minimum separations is that the lithographic pattern-transfer process must be very precise. The minimum feature size and the minimum feature separation depend upon the minimum mask dimensions that are available for the particular lithographic process. This in turn depends upon various factors including the lithographic process itself and the wafer topography. Minimum feature size and separation also depend upbn the feature change associated with the particular process step.

This feature change in turn depends upon the pattern-transfer process. Anisotropic etching produces minimum size changes. In contrast, where isotropic etching is used, the final IC feature may not be at all close in size to the lithographic feature size.

Present and future polysilicon resistance requirements can be met using polysilicon sheet resistance values ≲17 ohms per square.

Unfortunately, and as is well known, the very high polysilicon doping levels which are necessary to meet such low resistance requirements have been obtained at the cost of isotropic etch behavior and imprecise pattern-transfer. For example, as reported in Davies et al, U.S. Pat. No. 4,420,344, when polysilicon is doped to a sufficiently high level so that sheet resistance is much below about 50 ohms per square (500 nm; $2.5 \times 10^{-3}$ ohm-m), etching occurs preferentially along grain boundaries, etching characteristics degenerate dramatically and fine line patterning becomes impossible.

Several very undesirable results of isotropic etch behavior can be illustrated using the self-aligned silicon gate technology as an example. In the self-aligned fabrication process, the gate length establishes the channel length. If the etch process is isotropic to the polysilicon gate material and the mask outline is not transferred precisely the gate, the gate walls will be sloped or undercut. During the subsequent source/drain implantation, the tapered gate profile will be transferred to the source/drain doping profile. This sloped profile may increase the required size of the gate mask feature and require greater separation between the source and drain to prevent shorting, and may cause a variable channel length. Any one or all of these results are highly undesirable, particularly under the increasingly stringent physical and operational tolerances of scaled VLSI devices.

At least several new materials and processes have been developed in attempts to avoid the choice which classical polysilicon technology requires between low resistance and effective pattern transfer. For example, molybedenum and tungsten have been investigated as possible gate materials. See, for example, Kashiwagi, *Trends in Gate Electrode Materials and Process for VLSI's of the Next Generation*, J. S. T. News, Vol. 2, No. 6, pp. 30–33, December 1983.

In addition, within the last several years polycide has been substituted for polysilicon in a number of applications. Polycide is a layer of metal silicide (such as molybdenum-silicide or tungsten-silicide) over a layer of polysilicon. Presently, polycide technology can provide conductor sheet resistances of about four to seven ohms per square. Polycide, however, has several serious processing shortcomings. First, there is no known single step anisotropic etch process for polycides. The available etchants provide insufficient anisotropy for one or both of the constituent layers. Also, polysilicon etches faster than silicide and causes undercutting of the silicide, with a resulting loss in adhesion of the silicide and step coverage problems. Another consideration is the difficulty in obtaining sufficient etching selectivity with respect to an underlying oxide such as the gate oxide in the self-aligned gate process. As a result of these problems, the IC industry has been forced to develop multi-step etch processes for polycides.

Secondly, the unsatisfactory etch characteristics of annealed silicides requires that polycide etching be done prior to annealing. This requires that the anneal be performed relatively late in the fabrication process, when it may degrade existing structures, for example, by diffusing source/drain regions or other impurity regions.

The inherent shortcoming of substitutional technology such as metal silicides and the need to further develop such technologies make it highly desirable to extend the classic polysilicon technology by providing anisotropic etch characteristics at low resistance, high doping levels.

Etching of relatively highly doped polysilicon can be made anisotropic, for example, by adding recombinant CCl$_4$ to RIE or C$_2$F$_6$ to plasma etching. Koike et al in Abstract No. 213 for the Electrochemical Society Spring Meeting, Montreal, Canada, May 9–14, 1982, reported anisotropic plasma etching of doped polysilicon using various carbon-containing etching gases such as C$_2$ClF$_5$. However, the reported etch data is for samples having sheet resistances which are greater than approximately 25 ohms per square and, typically, greater than approximately 50 ohms per square. Thus, the paper does not consider the very highly doped sheet resistances (approximately 20 ohms per square or lower; doping impurity concentrations $\geq 10^{20}$ cm$^{-3}$) which are of primary interest in terms of extending classical polysilicon technology. Furthermore, it is highly undesirable to use carbon in the plasma-producing gas, for it tends to form polymerized deposits on the poly and is very difficult to remove from vertical walls. Oxygen can be added to the etching gas mixture to clear the carbon, but oxygen increases the lateral etching tendency which carbon is intended to eliminate.

Recently, Schwartz and Schaible reported an investigation of etching rates and profiles for highly doped silicon. See *The Effects of Arsenic Doping and Reactive Ion Etching of Silicon in Chlorinated Plasmas*, published in the Journal of the Electrochemical Society, Vol. 130, No. 9, September 1983, pp. 1898–1905. In n-type polysilicon (concentrations $\geq 10^{20}$ cm$^{-3}$), undercutting was observed to be an inherent problem. The maximum undercut was approximately one-half as great using CCl$_4$ etching gas as for Cl$_2$ etching gas. However, any advantage in the lessened undercutting is probably offset by the use of carbon. Furthermore, even for CCl$_4$ etching gas, undercutting ranged from approximately 0.25 to 0.5 for impurity concentrations $\geq 10^{20}$ cm$^{-3}$, which is highly undesirable.

Schwartz et al did not determine what mechanism is responsible for the undercutting (isotropy) associated with very heavily doped silicon. They did conclude that the impurity doping somehow increased the chemical component of the etching reaction and the dependence of etch rate on temperature. This article is believed to be representative of the current state of the polysilicon technology in that it evidences a lack of awareness of the precise operative mechanism which is responsible for the undesired isotropic etch characteristics of highly doped silicon. Nor is there any recognition or suggestion that rapid thermal annealing can provide a solution to the resistance/pattern transfer dilemma.

In view of the above, it is an object of the present invention to extend the polysilicon technology by providing a process for treating polysilicon which provides very highly doped polysilicon which is nonetheless characterized by anisotropic etching.

It is another object of the present invention to provide a process for treating polysilicon which provides an optimized combination of low resistance, high etch rate, and anisotropic etch characteristics.

It is yet another object of the present invention to provide a process for providing optimum anisotropy and/or etch rate and/or sheet resistance by rapid thermal annealing of implanted polysilicon.

It is still another object of the present invention to provide a method for determining the precise combination of parameters which are necessary to provide optimum anisotropy and/or etch rate and/or sheet resistance for a given doping level and annealing temperature.

SUMMARY OF THE INVENTION

In one aspect, the present invention relates to a method for treating polycrystalline silicon to provide low sheet resistance and anisotropic plasma etching characteristics to the polysilicon. In this respect, the method involves doping the polysilicon material as by ion implantation (which is a "cold" process), heating the doped polysilicon at a selected temperature using rapid heating techniques so that the resulting time rate of change of the sheet resistance of the polysilicon comprises a plateau region of relatively constant sheet resistance which provides enhanced dopant activation and anisotropic etch characteristics.

In still another aspect, the present invention involves a method of treating polysilicon to provide an optimized combination of low sheet resistance and an anisotropic plasma etching profile, comprising implanting the polysilicon with a concentration $\gtrsim 10^{20}$ cm$^{-3}$ of impurities; and heating the doped polysilicon at a selected temperature/time using rapid thermal annealing. After terminating the heat pulse annealing at one of the associated time/temperature conditions, an etching mask is positioned over the polysilicon and the polysilicon is etched in the presence of the mask using a plasma etching technique.

As one example of the use of the method of the present invention in VLSI technology, the doping, heat pulse annealing and anisotropic etching sequence can be used to provide low sheet resistance ($\leq 10$ ohms per square) fine geometry, anisotropic ($\leq 0.1$) self-aligned silicon gate structures.

In another aspect, the rapid thermal annealing time/temperature condition is selected so that the time rate of change of sheet resistance of the polysilicon describes a transition to a plateau region of relatively constant sheet resistance. The transition and adjoining regions are characterized by annealing time spans associated with anisotropic polysilicon etch characteristics.

As a consequence of applying the present process, the polysilicon grain structure is amenable to the anisotropic etching required of small geometry devices. At the same time, the high impurity activation level of the polysilicon provides a high etch rate which is consistent with high throughput processing, as well as very low sheet resistance.

BRIEF DESCRIPTION OF THE DRAWINGS

The above and other aspects of the invention will be described in greater detail in conjunction with the drawings, in which:

FIGS. 1 and 2 illustrate the transition in the sheet resistance curve which is associated with anisotropic etch characteristics;

FIG. 4 schematically illustrates the process of forming the polysilicon structures which were used to obtain the data of FIGS. 1 through 3;

FIG. 5 schematically illustrates a commercially available heat pulse annealing cavity which was used for the heat pulse annealing step used herein;

FIG. 17 is a partial cross-sectional representation of a through-hole programmed mask ROM cell.

DETAILED DESCRIPTION

The present invention resulted from the discovery that, contrary to accepted theory, highly doped, low sheet resistivity polysilicon can be etched with a very high degree of anisotropy. The high etch rate is due to the high degree of activation (i.e., the increased level of free electrons) of implanted dopants after rapid thermal annealing. The anisotropy is mostly related to the poly grain structure which is formed using rapid thermal annealing. Rapid thermal annealing of very highly doped polysilicon has an associated time/temperature window which provides both highly anisotropic etch characteristics (i.e., $A_f \simeq 1$; anisotropy$\simeq 0$) and high etch rates. The resulting excellent pattern transfer characteristics make the inventive process and the resulting polysilicon structure well suited to the requirements of VLSI and to the fabrication of critical structures such as self-aligned silicon gate structures and poly interconnects.

The short annealing times associated with the above-mentioned heat pulse annealing window provide a very fast annealing process and increase production throughput.

Also, the short annealing process provides markedly less diffusion of existing impurity structures than does furnace annealing, which feature is very useful for scaled devices. In addition, the invention overcomes the primary shortcoming of polysilicon —the need to choose between optimum conductivity and optimum etch characteristics.

The invention thus extends classical polysilicon technology into areas where less than ideal substitutes such as silicides have been used.

In terms of specific applications, the process and the polysilicon structure of the present invention are applicable to various IC structures, including bipolar structures such as shallow polysilicon emitters; MOS and CMOS device structures such as silicon gate electrodes; single and multiple layer conductor and interconnect arrangements; and buried contacts.

It is believed that the observed polysilicon characteristics which result from the use of rapid thermal annealing are caused by an excursion through several structural stages. A particular structural stage which occurs early in the heating process (typically after several seconds) provides the desired combination of optimum etch characteristics and low sheet resistivity. The heating time window which is associated with this intermediate stage grain structure was not discovered previously, despite years of industry research, development and commercial process development in rapid thermal annealing and polysilicon technologies. The lack of discovery is at least partly due to the fact that the time/temperature window is of short duration (typically $\lesssim 10$ seconds), occurs very early in the heating process, and is bounded at both shorter and longer heating times by structures which provide isotropic etch characteristics in highly doped polysilicon.

Figure 1:
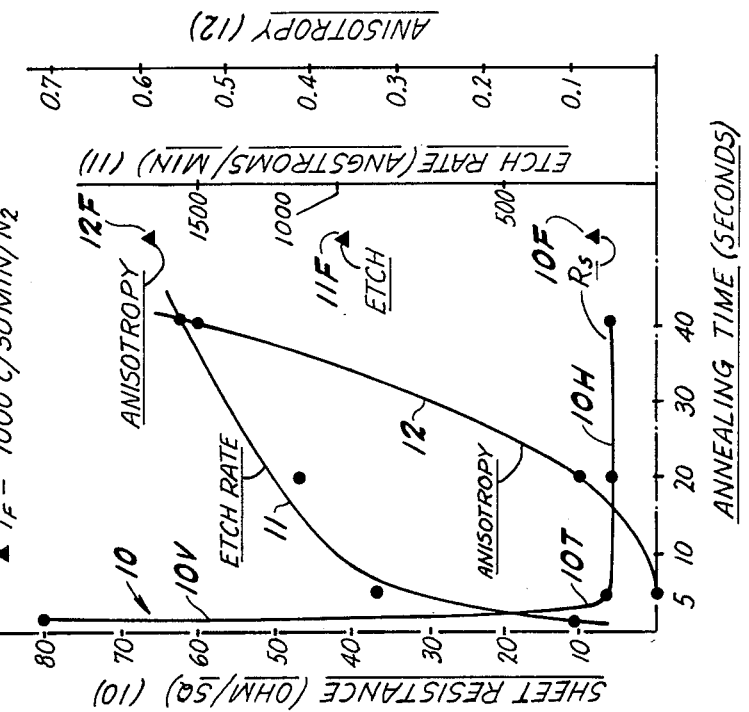

FIG. 1 illustrates graphically the sheet resistance (ohms per square), etch rate and anisotropy of heavily doped polysilicon layers which were rapid thermal annealed at 1200° C., or furnace annealed in dry nitrogen at 1000° C. for 30 minutes. Referring to FIG. 4, the polysilicon layers 41 were formed to a thickness of approximately 5,000 Angstroms on silicon substrates 43 by LPCVD (low pressure chemical vapor deposition). Those skilled in the art will understand that sheet resistance is dependent upon sheet thickness. The industry standard for calculating sheet resistance is 5,000 Angstroms or 500 nm. A polysilicon thickness of 5,000 Angstroms was used for all the examples described herein.

The samples were implanted with phosphorous using a dose of 5E16 ions/cm$^2$, a beam current of 10 milliamps and energy of 70 KeV.

The polysilicon structures were implanted using one of the available rapid thermal heating systems, the Model Heat Pulse 210M heat pulse annealing system which is commercially available from A. G. Associates of Palo Alto, Calif. As shown schematically in FIG. 5, the Heat Pulse 210M used during the experiments is designated by the reference numeral 50. The system comprises an annealing chamber having reflective walls 51—51 which are water-cooled 52 and have upper and lower banks of high intensity tungsten-halogen lamps 53—53. A quartz diffuser plate 54 is placed next to each lamp bank, positioning the stationary wafer equidistant between the light banks. The two rows of lamps provide a full intensity of about 19.5 Kw of radiant energy trapped within the reflectors, with the silicon wafer being the only absorbing medium. The lamp intensity is controlled in an open loop mode by a microcomputer. A typical heat pulse cycle consisted of increasing intensity at a constant rate, followed by a constant intensity anneal, and decreasing the intensity back to zero at the same rate. There are available a number of other rapid thermal annealing systems which may be suitable for use in praticing the present invention. For example, one such system employs graphite IR heating elements.

After treatment by heat pulse or by furnace annealing, and referring again to FIG. 4, photoresist masks 42 were formed on the polysilicon layers 41. The polysilicon layers were then treated by plasma etching using chlorinated etching gas, as follows:

GAS: HCl
FLOW: 90 sccm
PRESSURE: 15 mT (Millitorr)
POWER: 256 W
D.C. VOLTAGE: 250 V It should be noted that the power required to etch polysilicides is about four times greater than the power used here. At such high levels, the resulting radiation effects on gate oxides may require stripping of the oxide and forming a new gate oxide using an additional oxidation step.

It should also be noted that dry etch processes in general can be used to etch the highly doped polysilicon of the present invention. RIE reative ion etching was not required for anisotropic etching. That is, the above-described HCl process is a plasma etch process, not RIE. Plasma etching typically involves less radiation damage and less wafer heating than does RIE, which enhances photoresist survival.

Using the plasma etch, the polysilicon 42 was removed to the underlying substrate (SiO$_2$). The sheet resistance was determined by four point probe measurements and the anisotropy was measured from scanning electron micrographs (cross-section SEM at 90°).

The sheet resistance as a function of annealing time is indicated by the data points of curve 10, FIG. 1, for samples which were annealed using the heat pulse technique. Initially, this curve describes a very steeply sloped, nearly vertical function 10V which is connected by a short transition region 10T (at an annealing time of five seconds) to a nearly horizontal region 10H which is characterized by a nearly-constant sheet resistance of approximately seven ohms per square. The plateau 10H extends to the longest annealing time investigated, 40 seconds.

The etch rate for the rapid thermal annealed samples (curve 11) quickly rises from approximately 250 Angstroms per minute (at an annealing time of two seconds) to approximately 900 Angstroms per minute (at five seconds) and then increases more slowly to a rate of approximately 1,500 Angstroms per minute for the longest anneal time (40 seconds).

The anisotropy for rapid thermal annealing (curve 12) is initially zero (very high aspect ratio/vertical etching) at five seconds, at 20 seconds is still a very acceptable value of $\lesssim 0.1$, but then rapidly increases to approximately 0.55 at 40 seconds. If one arbitrarily establishes a stringent anisotropy requirement of 0.1 or lower (aspect ratio $A_f \geq 0.9$) and a minimum sheet resistance of approximately 10 ohms per square or lower, it is seen that the annealing time window spans approximately four seconds to 20 seconds of annealing time. The associated etch rate will vary from a very high value of approximately 750 Angstroms per minute to an exceptionally high value of approximately 1,200 Angstroms per minute.

Quite obviously, the window would expand or contract somewhat depending upon particular requirements for sheet resistance, anisotropy and etch rates. The word "somewhat" is used advisedly here, for the rapid rise in anisotropy to values of 0.2 (approximately 25 seconds) and 0.3 (approximately 30 seconds) will undoubtedly limit the maximum useful annealing time to about 30 seconds or less for the particular set of fabrication conditions when the process is used for the fabrication of critical fine geometry VLSI features.

Referring still further to FIG. 1, the corresponding furnace annealed samples also exhibited a low sheet resistance of approximately 10 ohms per square (data point 10F); and a very high etch rate of approximately 1,000 Angstroms per minute (data point 11F); but provided a totally unacceptable etch anisotropy value of about 0.58 (data point 12F).

Thus, the samples which were furnace annealed exhibited the enhanced etch rates and undercutting which one would expect based upon investigations such as that done by Schwartz and Schaible. However, the samples which were treated by rapid thermal annealing exhibited an unexpected optimum combination of low sheet resistance, excellent anisotropy and high etch rates at the transition region 10T of the sheet resistance curve 10, and the adjoining regions of the curve. This transition region and adjoining regions provide a relatively narrow annealing time window which starts at annealing times of $\simeq$ five seconds, lasts about 15 seconds, and provides optimum polysilicon resistance and etch characteristics.

Figure 2:
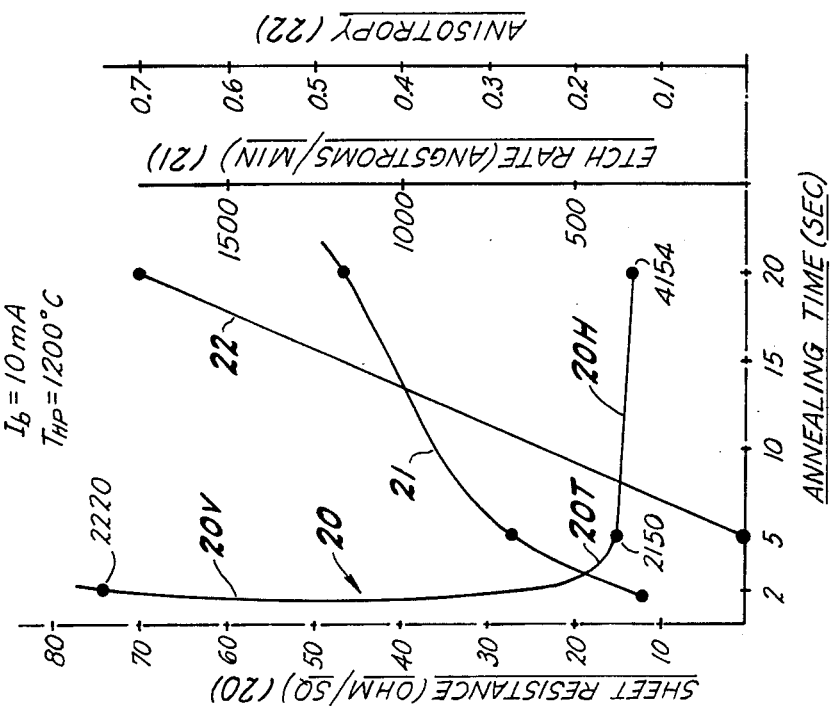
FIGS. 1 through 3 each illustrate plots of sheet resistance, etch rate and anisotropic etch behavior as a function of annealing time.

FIG. 2 illustrates the data taken from a second set of samples which were implanted, rapid thermal annealed and etched in the manner of the FIG. 1 samples except that the phosphorous implantation was done using a dose of 2E16 ions/cm$^2$. The exhibited characteristics are similar to those of FIG. 1. That is, the sheet resistance associated with rapid thermal annealing (curve 20) steeply descreases to a transition region 20T (approximately three to five seconds annealing time), then levels off to a plateau 20H of approximately 15 ohms per square which extends to the maximum annealing time of 20 seconds. The associated plasma etch rate (curve 21) increases from approximately 350 Angstroms per minute (two seconds) to approximately 1,200 Angstroms per minute (20 seconds). Finally, as shown by the data points for curve 22, anisotropy ranges from approximately zero at five seconds to 0.7 at 40 seconds.

The primary difference between FIGS. 1 and 2 is the higher FIG. 2 sheet resistance values in plateau region 20H and the shorter FIG. 2 annealing times which are associated with particular anisotropy values. In FIG. 2 the anisotropy values of 0.2 and 0.3 occur at the relatively short annealing times of about eight and 12 seconds, respectively. Nonetheless, curve 20 does exhibit a transition region, 20T, and an associated combination of low sheet resistance, excellent etch anisotropy and high etch rate. Here, a sheet resistance of $\lesssim(15-20)$ ohms per square and anisotropy of $\lesssim 0.1$ occur for an annealing time of about three to seven seconds.

Figure 3:
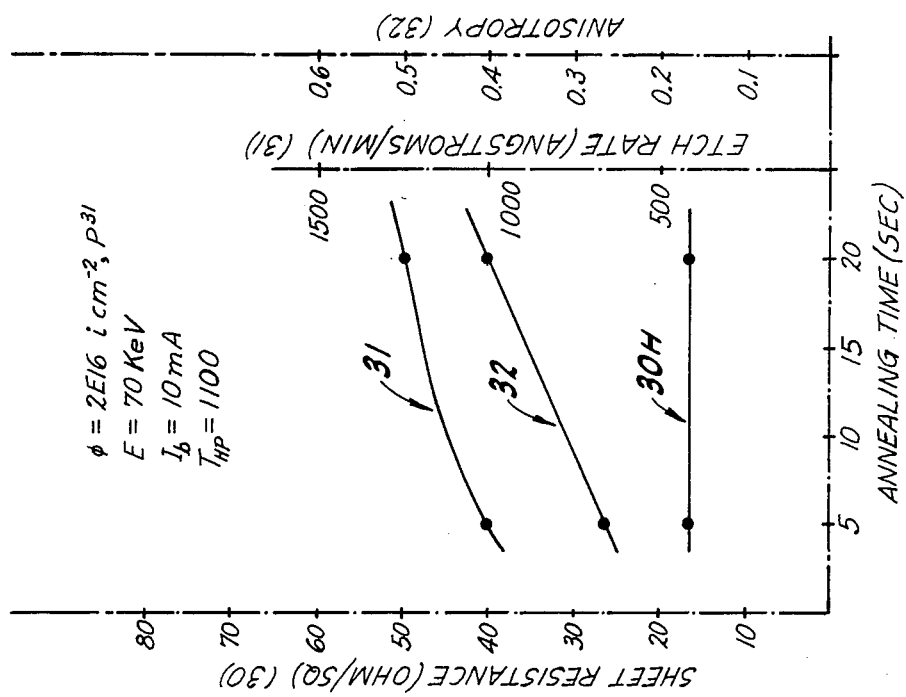

FIG. 3 shows the results of a third set of samples which were treated by heat pulse annealing. The samples were treated identically to those of FIG. 2 except that the rapid thermal annealing temperature was 1100° C. The resulting sheet resistance (curve 30H) describes a plateau region at a value of approximately 17 ohms per square. The curve 30 does not exhibit a region of sharply descreasing resistance or a transition region as does FIGS. 1 and 2. The etch rate (curve 31) ranges from approximately 1,000 Angstroms per minute (five seconds) to approximately 1,250 Angstroms per minute (20 seconds). Finally, the anisotropy data of FIG. 3 (line 32) ranges from approximately 0.27 at five seconds to 0.4 at 20 seconds. Extrapolating backwards the data for anisotropy curve 32 would provide a minimum anisotropy which is still in excess of 0.2. Thus, this set of data does not exhibit the excellent anisotropy which is associated with the transition regions 10T and 20T of FIGS. 1 and 2.

Comparison of FIG. 2 and FIG. 3 suggests that anisotropy is related to the heat pulse annealing temperature (to the time/temperature product) and that for a particular impurity concentration, there exists a minimum temperature below which low anisotropy values cannot be obtained. The processing parameters of FIGS. 2 and 3 were identical except for the annealing temperature. The samples of FIG. 2 were heat pulse annealed at 1200° C. and attained a minimum anisotropy value of 0 (vertical walls) at an annealing time of five seconds or less.

In contrast, a temperature of 1100° C. was used for the samples of FIG. 3 and provided a minimum anisotropy value of only about 0.27 at a corresponding annealing time of five seconds. Thus, in situations where it is mandatory to have anisotropy values of less than approximately 0.2, it is apparent that (for the given implant conditions) the minimum heat pulse annealing temperature is within the range 1100° C. to 1200° C. It is obvious that for each doping concentration there is an optimum time/temperature product which modifies the polysilicon structure in a way which provides the anisotropic etch.

Figure 6:
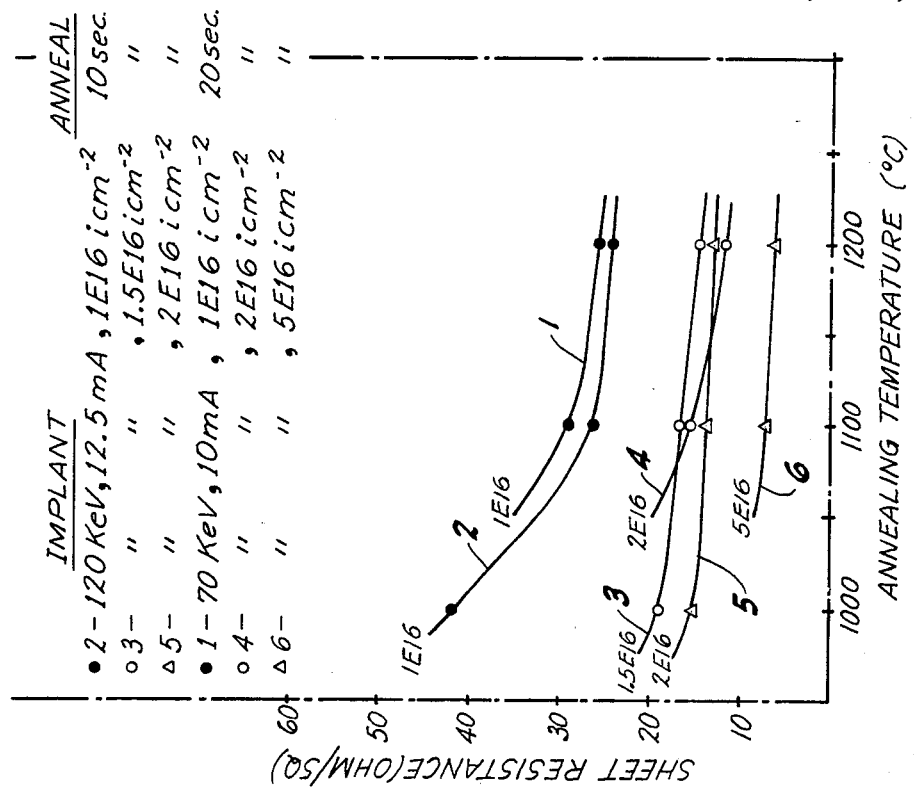
FIG. 6 illustrates the effect on sheet resistance of various implanting and annealing parameters.

FIG. 6 shows that the characteristic plateau regions of the sheet resistance curves in FIGS. 1 through 3 exist for various implant parameters and heat pulse annealing temperatures. The characteristic near-hyperbolic shape of the sheet resistance curves of FIGS. 1 and 2 and the transition region which is associated with anisotropic etching will exist for a wide range of inter-dependent parameters, including annealing time windows of up to about 20 seconds; p-type and n-type doping concentrations of $10^{20}$ to $>5\times10^{21}$ cm$^{-3}$, and annealing temperatures of 1100° to 1200° C.

Figure 9:
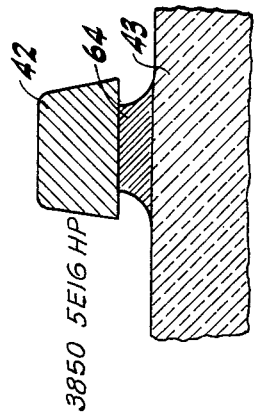
FIGS. 7, 8 and 9 are micrographs illustrating the etching profile for samples which provided the data points for the sheet resistance versus annealing time curve of FIG. 1.
Figure 8:
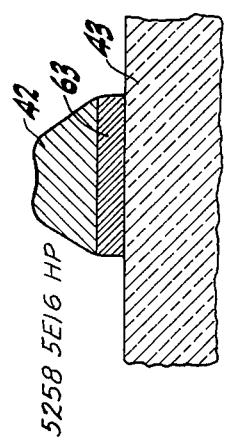
Figure 7:
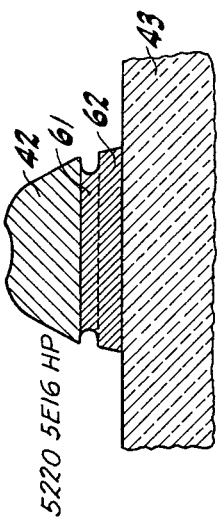

Before considering the grain structure models which are believed responsible for the behavior exhibited by the data in FIGS. 1 through 3, it is helpful to examine exemplary micrographs which provided the data for sheet resistance curve 10, FIG. 1 and curve 20, FIG. 2. Consider first curve 10, FIG. 1. The micrograph cross-section for sample 5220 (t=two seconds) is shown in FIG. 7. The etch mask and substrate are designated by reference numerals 42 and 43, respectively. Sample 5220 exhibits isotropic and anisotropic etch profiles, respectively, in polysilicon "layers" 61 and 62. (The reference numerals 61-64 used in FIGS. 7-9 represent both the polysilicon layer 41 of FIG. 4 and its changing grain structure and etch characteristics.) This etching behavior is consistent with a thin, amorphized, highly doped implanted surface region 61 and a thicker, lightly doped, bulk region 62, both of which are relatively unaffected by the short anneal. A scanning electron micrograph cross-section is shown in FIG. 8 for the transition sample 5250 (t=five seconds). The sharp vertical profile across the thickness of the polysilicon layer 63 evidences the existence of a different grain structure for this transitional structure as compared to samples 5220 and 3850. Finally, and referring to the scanning electron micrograph cross-section of FIG. 9, the sample 3850 (t=40 seconds) exhibits considerable undercutting. Closer inspection of FIG. 9 using magnification reveals a wavy profile at the etch of polysilicon layer 64 which is consistent with a structure consisting of large lateral grains with interstitial impurities and defects.

Figure 12:
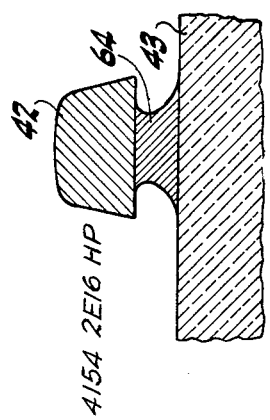
FIGS. 10, 11 and 12 are micrographs illustrating the etching profile for samples which provided the data points for the curves of FIG. 2.
Figure 11:
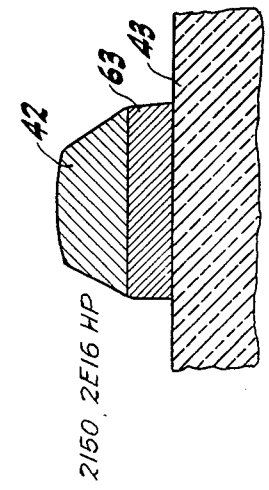
Figure 10:
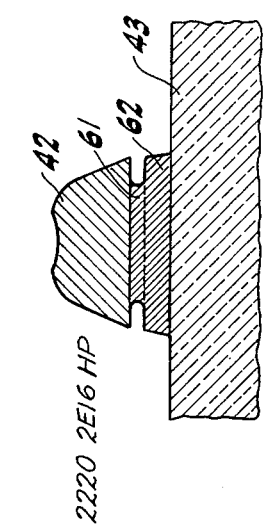

FIGS. 10, 11 and 12 are micrograph cross-sections for the samples of FIG. 2, specifically samples 2220, 2150 and 4154 corresponding to the FIG. 1 samples 5220, 5250, 3850 (t=2.5, 5 and 40 seconds, respectively). The micrograph cross-sections and etch results discussed above regarding FIG. 1 data points/samples 5220 (FIG. 7), 5250 (FIG. 8) and 3850 (FIG. 9) apply to the corresponding FIG. 2 samples 2220 (FIG. 10), 2150 (FIG. 11) and 4154 (FIG. 12).

Consider now the three structural stages of heat pulse annealing. These stages are consistent with the data of FIGS. 1-3 and the etch profiles shown in FIGS. 7-9 and 10-12. Initially, prior to heavy implantation and annealing, the lightly doped polysilicon layer is characterized by relatively large random grains and a sheet resistance of approximately 80 ohms per square. After the high-dose ion implantation, the thin surface-adjacent region 61 of the polysilicon layer is very highly doped ($\geq 10^{20}$ cm$^{-3}$), but the relatively thicker layer 62 is essentially unchanged from the starting structure. The implantation amorphizes the layer 61; it has essentially no grain structure other than some very small grains. These theoretical grain structures of the implanted, short time annealed layers 61 and layer 62 account for the observed isotropic and anisotropic etch characteristics of the layers in FIGS. 7 and 10.

During the initial rapid thermal annealing associated with vertical region 20V of the sheet resistance annealing time curve, the annealing time is too short to affect the bulk layer 62. Recrystallization does occur in layer 61, producing a high concentration of very small grains and defects in an amorphous background. This structure provides isotropic etch characteristics to layer 61, whereas layer 62 is still characterized by the aniostropic etch profile of undoped or lightly doped polysilicon.

As the annealing time is increased, redistribution and recrystallization extend region 61 until region 62 is entirely consumed. This occurs after a short annealing time. The polysilicon structure quickly progresses through the grain structure associated with the transition region 20T. The polysilicon has been transformed into a structure 64 having large, laterally extending grains with interstitial areas which contain amorphous material and a very high concentration of impurities and defects at grain boundaries. There is a very high activation level of impurities, but in the degenerate silicon there exists a much greater concentration of impurities than can be activated. As a result, the inactive impurities change the grain structure of the polysilicon layer, but do not substantially change the sheet resistance in the plateau region 20H. The boundaries of the laterally-oriented, large, growing grains are believed to act as gettering sites for impurities and defects. As a result, etching is enhanced between the laterally spread grains and is highly isotropic.

During the short annealing time window between the consumption of region 62 by the amorphous, small-grained structure (curve 20V; first stage structure) and the laterally-oriented, large grain, clustered structure 64 (curve 20H; third stage structure), there briefly exists an intermediate stage structure which is responsible for anisotropic etching across the thickness of the polysilicon 63 shown in FIGS. 8 and 11. While the structure has not been physically observed to date, the nature of the first and third stage structures and the anisotropic etching associated with the intermediate stage suggest that the intermediate stage structure is columnar. However, the important thing is the strong indication of the existence of such a structure. Also, while exact knowledge of the type of structure will undoubtedly be of benefit in other ways, the important thing in terms of the present invention is the existence of the annealing window behavior which has been observed for the data of FIGS. 1 and 2.

Those of usual skill in the art will readily apply the above-described methodology and resulting implanted, annealed polysilicon structure to essentially any process or structure which requires or merely benefits from the use of polysilicon which has (1) very low sheet resistance, (2) highly anisotropic etch characteristics and (3) a high etch rate. Several applications of the present process and structure are described below. However, with the very wide potential applicability in mind, it is to be understood that these examples are given by way of illustration and not by way of limitation.

Figure 13:
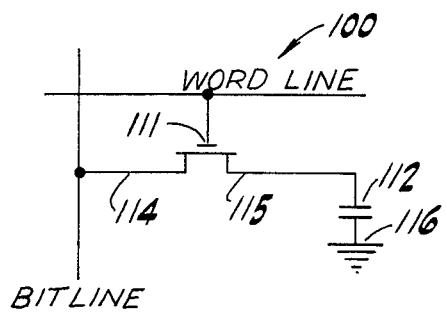
FIGS. 13 and 14 are, respectively, a circuit schematic and a cross-sectional representation of a random access memory cell which uses self-aligned polysilicon gate technology.
Figure 14:
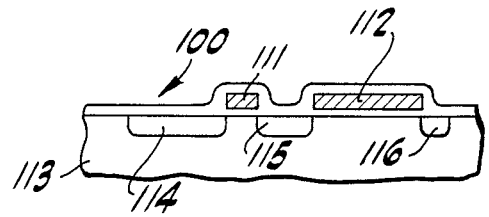

FIGS. 13 and 14 show a conventional dynamic random access memory cell 100 which utilizes self-aligned polysilicon gate technology. The silicon gate 111 for the access transistor and the polysilicon plate 112 for the storage capacitor can be formed at the same time using the low sheet resistance, anisotropic etch-process of the present invention. That is, the polysilicon layer which comprises gate 111 and plate 112 can be deposited over the oxide-covered substrate structure 113, and implanted to a surface concentration $\geq 10^{20}$ cm$^{-3}$ during or after the deposition process. Then, the polysilicon is heat pulse annealed at a temperature and for a time selected to provide a desired low polysilicon sheet resistance of which corresponds to the associated transition region of the sheet resistance curve. The silicon is next etched in the presence of an etching mask using plasma etching to provide the desired vertical sidewall profile to the gate 111 and plate 112. The normal fabrication sequence for the DRAM circuit is then resumed, including the self-aligned formation of the diffusion regions 114, 115 and 116.

Figure 15:
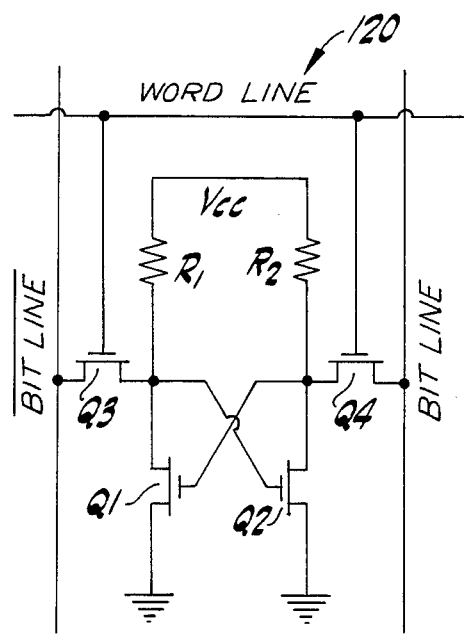
FIGS. 15 and 16 are, respectively, a circuit schematic and a cross-sectional representation of a static random access memory cell which uses self-aligned silicon gate technology.
Figure 16:
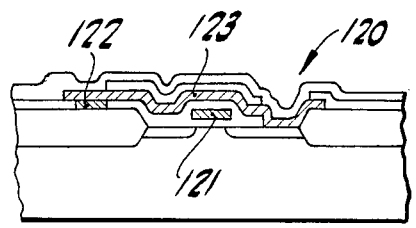

FIGS. 15 and 16 illustrate another application of the present invention, in this case to the formation of a static random access memory cell 120 which employs polysilicon load resistors $R_1$ and $R_2$. As shown in FIG. 16, the SRAM cell 120 utilizes two levels of polysilicon; the polysilicon gate 121 and the interconnect 122 for the load resistors comprise the first level, whereas the load resistors themselves as well as associated interconnects and poly-to-substrate contacts comprise the second level. The first level including the self-aligned polysilicon structure 121 can be formed as described relative to DRAM 100, FIG. 14. The second level can be formed using the normally high poly resistance to advantage in forming the poly resistors $R_1$ and $R_2$. In addition, by using appropriate masking of the resistor regions during the high level impurity doping step, the high-level doping, fine geometry technique of the present invention can be applied to form the second level.

FIG. 17 illustrates still another application of the present invention, in this case to the formation of a through-hole programmed mask ROM cell 130 which comprises a double-level poly structure and thus requires a double polysilicon etch. The particular configuration 130 is that disclosed in *A NEW MASK ROM CELL PROGRAMMED BY THROUGH-HOLE USING DOUBLE POLYSILICON TECHNOLOGY*, by Fujio Masuoka et al, I.E.D.M. 1983, and is used for purposes of illustration. Those skilled in the art will appreciate that the present invention is applicable in general to ROM structures and processes. The through-hole programmed ROM 130 includes a first level polysilicon layer which includes the transistor gates 131, source 132, drain/buried contact 133, and a second level polysilicon layer 134. The through-hole programming is attained by making contact to selected transistors of the ROM matrix using aluminum metallization 135. The use of the precisely patterned low sheet resistance polysilicon of the present invention provides smaller device size and greater density and higher speed than is available using conventional technology.

In still other applications, the present invention is ideally suited for forming the polysilicon layers used in non-volatile memories such as EPROMs, EAROMs and EEPROMs, including both MNOS technology (which itself includes SNOS and SONOS) and floating gate technology. Current practice is to use as many as three polysilicon layers for such memory structures and, accordingly, the present invention is well-suited to such technology. One exemplary recent non-volatile structure to which the present invention is applicable is described in *EPROM NON-VOLATILE MEMORY TECHNOLOGY WITH DOUBLE POLY GATE STRUCTURE*, by S. Ohaya et al, I.E.D.M. 1983.

In addition, and as one example of application to bipolar technology, the present invention can be used to form polysilicon stacked emitter structures which are applicable, for example, to very high frequency bipolar transistors. Use of the present invention provides shallow emitters with low defect densities and highly effective dopant activation and improved $\beta$. Such emitter structures (and in general any structure in which silicon is doped from an overlying polysilicon layer) can be formed substantially free of harmful implant radiation damage. This is because the radiation damage occurs in the polysilicon during the doping implant step. Using the present ion implantation and annealing process, the defects created in the overlying polysilicon are not diffused into the substrate. At the same time, the rapid thermal anneal recrystallizes and regrows the polysilicon grain structure so that the polysilicon defects are essentially eliminated. The anisotropic etch of poly produced by the described patent maintains a high control of emitter area and consequently a tight control of lateral diffusion during emitter formation.

As mentioned previously, current polycide structures uses a layer of metal silicide on a layer of polysilicon to provide minimum sheet resistances of about four to seven ohms per square. That value, of course, is equaled by the polysilicon structure of the present invention, without the attendant disadvantages of polycide which were discussed previously. In addition, even lower sheet resistance values can be obtained by forming a low sheet resistance polysilicon layer according to the present invention followed by the formation of an overlying layer of metal or of metal silicide such as molybdenum silicide or tungsten silicide. The two-layer structure provides a parallel resistance arrangement in which the overall resistance is given by:

$$1/R_t = 1/R_p + 1/R_m$$

where $R_p$ is the resistance of the polysilicon and $R_m$ is the resistance of the overlying metal or metal silicide. The result is an ultra-low sheet resistance structure.

Thus, there has been described a method for forming highly doped, low sheet resistance polysilicon which has excellent anisotropic etching characteristics. General and specific examples of the use of this process have been described. Those of usual skill in the art will readily expand and extend the method and its use while remaining within the teachings set forth in this patent document.

What is claimed is:

1. A method for treating polysilicon material to provide low sheet resistance and anisotropic dry etching characteristics, comprising doping the polysilicon material using impurities selected from n-type and p-type impurities; heating the polysilicon material at a selected temperature using rapid thermal annealing so that the time rate of change of the sheet resistance of the polysilicon material describes a region of relatively constant slope having at least a portion thereof characterized by an annealing time span which is associated with anisotropic etching of the polysilicon material; and terminating annealing at a time within the time span.

2. A method for treating polysilicon material to provide low sheet resistance and anisotropic plasma etching characteristics, comprising doping the polysilicon material using impurities selected from n-type and p-type impurities; heating the polysilicon material at a selected temperature using rapid thermal annealing so that the time rate of change of the sheet resistance of the polysilicon material describes a transition to a relatively shallowly sloped plateau region, the transition region and adjoining portion of the plateau region being characterized by an annealing time span which is associated with anisotropic etching of the polysilicon material; and terminating annealing at a time within the time span.

3. A method of treating a layer of polysilicon material to provide low sheet resistance and anisotropic plasma etching characteristics, comprising forming a composite comprising the polysilicon layer on a support; doping the layer of polysilicon using impurities selected from n-type and p-type impurities; inserting the composite into a rapid heating chamber adapted for heating one or more wafers simultaneously; and heating the layer of polysilicon material in the chamber at a temperature of at least about 1100° C. for a time within the range of between about five and thirty seconds.

4. A method of treating a layer of polysilicon material to provide low sheet resistance and anisotropic plasma etching characteristics, comprising forming a composite comprising the polysilicon layer on a wafer; doping the layer of polysilicon to a concentration $\geq 10^{20}$ cm$^{-3}$ using impurities selected from n-type and p-type impurities; inserting the composite into a rapid radiant heating chamber adapted for heating one or more wafers simultaneously; and heating the layer of polysilicon material in the chamber at a temperature of at least about 1100° C. for a time within the range of between about five and thirty seconds.

5. The polysilicon treatment method of claim 3 or 4 wherein the resulting polysilicon sheet resistance is $\leq 17$ ohms per square and the plasma etch anisotropy is $\leq 0.2$.

6. The polysilicon treatment method of claim 3 or 4 wherein the temperature is equal to or greater than about 1200° C. and the resulting polysilicon sheet resistance is $\leq 7$ ohms per square and the plasma etch anisotropy is $\leq 0.1$.

7. The polysilicon treatment method of claim 3 or 4 wherein the temperature is equal to or greater than about 1200° C. and the resulting polysilicon sheet resistance is $\leq 7$ ohms per square, the plasma etch anisotropy is $\leq 0.1$ and the polysilicon is doped by implanting at least a surface-adjacent region thereof to a concentration $\geq 10^{20}$ cm$^{-3}$.

8. The polysilicon treating method of claim 3 or 4 wherein the etching step is plasma etching using a chlorinated etching gas.

9. The polysilicon treating method of claim 3 or 4 wherein the etching step is plasma etching and the eteching gas comprises HCl.

10. The polysilicon treatment method of claim 7 wherein the impurities implanted are n-type impurities selected from one of phosphorous, antimony and arsenic.

11. The polysilicon treatment method of claim 7 wherein the annealing temperature is within the approximate range 1100° C.–1200° C. and the associated annealing time span is $\lesssim 20$ seconds.

12. The polysilicon treatment method of claim 10 wherein the implantation step is performed at a dose within the approximate range $10^{16}$–$10^{17}$ ions per cm$^2$.

13. A method of treating a layer of polysilicon material to provide low sheet resistance and an anisotropic plasma etching profile, comprising forming a composite comprising the layer of polysilicon on a semiconductor wafer; implanting at least a selected depth of the polysilicon material to a concentration $\geq 10^{20}$ cm$^{-3}$ of impurities selected from n-type and p-type impurities; inserting the layer of polysilicon material into a rapid thermal annealing chamber adapted for heating one or more wafers simultaneously; heating the polysilicon material in the chamber at a temperature of at least about 1100° C. using rapid thermal annealing so that the time rate of change of the sheet resitivity of the polysilicon material describes a transition region to a relatively shallowly sloped plateau region, the transistion region and adjoining portion of the plateau region being characterized by an associated annealing time span of between about five and thirty seconds and by anisotropic etching of the polysilicon material when annealed for a time within the time span; terminating annealing at a time within the time span, positioning an etching mask over the polysilicon; and etching the polysilicon in the presence of the mask using plasma etching.

14. A method for forming a polysilicon gate of precisely controlled side profile on a substrate, comprising forming a composite structure comprising a layer of polycrystalline silicon on the substrate; implating the silicon with impurities to a surface conecntration of at least about $10^{20}$ cm$^{-3}$; inserting the composite into a rapid thermal annealing chamber adapted for heating one or more such composites simultaneously; heating the composite in the chamber of at a temperature greater than about 1100° C. and for a time of between about five and thirty seconds to provide a sheet resistance $\leq 17$ ohms per square and a selected aspect ratio $\leq 0.1$ during ecthing; etching the silicon in the presence of an etching mask using plasma etching to pattern the silicon to a desired configuration and the selected profile aspect ratio; and doping the substrate structure using the polysilicon as a deposition mask.

15. The method of claim 14 wherein prior to the implanting step, a layer of silicon dioxide is formed on the silicon to lower the implantation dose required to achieve the selected sheet resistance value.

16. A method for treating polysilicon material to provide low sheet resistance and anisotropic plasma etching characteristics comprising doping the polysilicon material to a concentration of at least about $10^{20}$ cm$^{-3}$ using impurities selected from n-type and p-type impurities; and heating the polysilicon material using rapid thermal annealing at a temperature of at least about 1100° C. for a time within the range five seconds to thirty seconds.

* * * * *